(12) United States Patent
Allen

(10) Patent No.: US 12,669,550 B2
(45) Date of Patent: Jun. 30, 2026

(54) SYSTEMS AND METHODS FOR BATTERY REACTIVE IMPEDANCE MEASUREMENTS

(71) Applicant: Renesas Electronics America Inc., Milpitas, CA (US)

(72) Inventor: Anthony John Allen, Los Gatos, CA (US)

(73) Assignee: Renesas Electronics America Inc., Milpitas, CA (US)

( * ) Notice: Subject to any disclaimer, the term of this patent is extended or adjusted under 35 U.S.C. 154(b) by 219 days.

(21) Appl. No.: 18/541,385

(22) Filed: Dec. 15, 2023

(65) Prior Publication Data

US 2024/0264239 A1 Aug. 8, 2024

Related U.S. Application Data

(60) Provisional application No. 63/483,323, filed on Feb. 6, 2023.

(51) Int. Cl.
G01R 31/389 (2019.01)
G01R 31/3842 (2019.01)
(52) U.S. Cl.
CPC ....... G01R 31/389 (2019.01); G01R 31/3842 (2019.01)

(58) Field of Classification Search
None
See application file for complete search history.

(56) References Cited

U.S. PATENT DOCUMENTS

| | | | | |
|---|---|---|---|---|
| 6,838,883 B2 * | 1/2005 | Kanou | ................. | G01R 31/379 |
| | | | | 324/439 |
| 2011/0204898 A1 * | 8/2011 | Kim | .................... | G01R 31/3842 |
| | | | | 324/434 |
| 2020/0132781 A1 * | 4/2020 | Marsili | ................ | G01R 31/389 |

* cited by examiner

*Primary Examiner* — Jas A Sanghera
(74) *Attorney, Agent, or Firm* — SCULLY, SCOTT, MURPHY & PRESSER, P.C.

(57) ABSTRACT

Systems and methods for battery reactive impedance measurement is generally described. The method can include measuring a voltage of a battery cell. The method can further include measuring a current flowing through the battery cell. The method can further include determining a time offset based on the voltage and the current. The time offset can cause the voltage and current to be in-phase. The method can further include sampling the voltage and the current based on the time offset. The method can further include determining an impedance of the battery cell based on the sampled voltage and sampled shifted current.

18 Claims, 4 Drawing Sheets

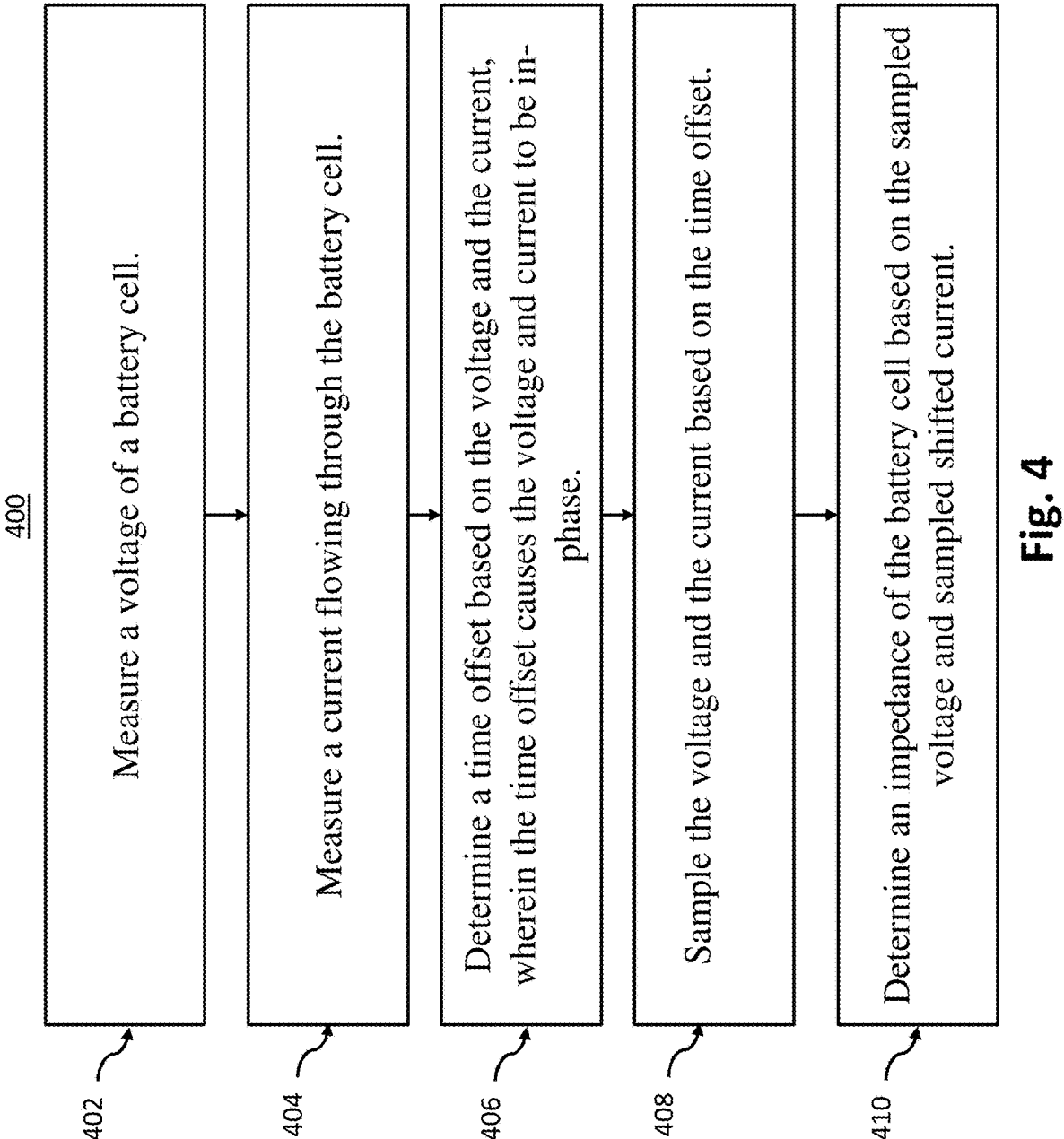

400

402 — Measure a voltage of a battery cell.

404 — Measure a current flowing through the battery cell.

406 — Determine a time offset based on the voltage and the current, wherein the time offset causes the voltage and current to be in-phase.

408 — Sample the voltage and the current based on the time offset.

410 — Determine an impedance of the battery cell based on the sampled voltage and sampled shifted current.

Fig. 4

SYSTEMS AND METHODS FOR BATTERY REACTIVE IMPEDANCE MEASUREMENTS

CROSS-REFERENCE TO RELATED APPLICATION

The present application claims the benefit of U.S. Patent Application No. 63/483,323, titled "SYSTEM AND METHOD FOR DETERMINING REACTIVE IMPEDANCE OF A BATTERY" and filed on Feb. 6, 2023, which is hereby incorporated by reference in its entirety.

BACKGROUND

The present disclosure relates to systems and methods for determining reactive impedance of a battery.

Multi-cell batteries such as those used in electric vehicles or in fixed base energy storage systems can have multiple circuits measuring the voltages of cells in the battery pack, but only one circuit measuring the current in the pack. Further, these voltage measurement and current measurement circuits can be in different locations in the battery pack. The complex impedance of each of the cells in these battery packs can be determined from the measured voltages and current. The complex impedance can be used for monitoring the health of the cells and for extracting various information of the cells, such as temperature information, from the impedance characteristics of the measured impedance.

SUMMARY

In one embodiment, a method for battery reactive impedance measurement is generally described. The method can include measuring a voltage of a battery cell. The method can further include measuring a current flowing through the battery cell. The method can further include determining a time offset based on the voltage and the current. The time offset can cause the voltage and current to be in-phase. The method can further include sampling the voltage and the current based on the time offset. The method can further include determining an impedance of the battery cell based on the sampled voltage and sampled shifted current.

In one embodiment, a semiconductor device for battery reactive impedance measurement is generally described. The semiconductor device can include a controller configured to obtain a voltage of a battery cell. The controller can further obtain a current flowing through the battery cell. The controller can further determine a time offset based on the voltage and the current. The time offset can cause the voltage and current to be in-phase. The controller can further sample the voltage and the current based on the time offset. The controller can further determine an impedance of the battery cell based on the sampled voltage and sampled shifted current.

In one embodiment, a system for battery reactive impedance measurement is generally described. The system can include a battery cell. The system can further include a cell monitor configured to measure a voltage of the battery cell. The system can further include a pack monitor configured to measure a current flowing through the battery cell. The system can further include a controller configured to determine a time offset based on the voltage and current. The time offset can cause the voltage and current to be in-phase. The controller can further sample the voltage and the current based on the time offset. The controller can further determine an impedance of the battery cell based on the sampled voltage and sampled shifted current.

Further features as well as the structure and operation of various embodiments are described in detail below with reference to the accompanying drawings. In the drawings, like reference numbers indicate identical or functionally similar elements.

BRIEF DESCRIPTION OF THE DRAWINGS

FIG. 4 is a flow diagram illustrating a process to implement battery reactive impedance measurement in one embodiment.

DETAILED DESCRIPTION

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1:
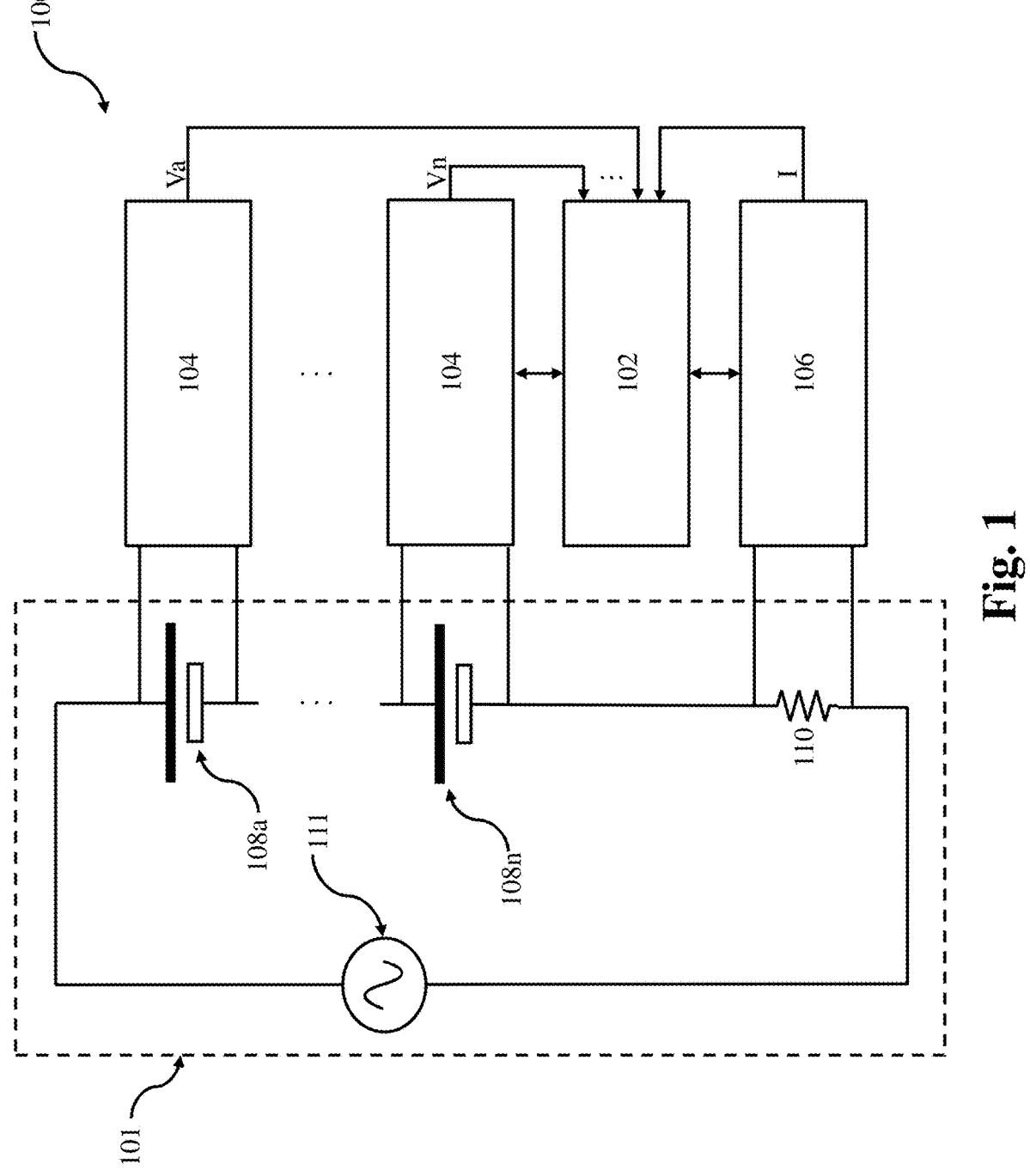
FIG. 1 is a diagram showing an example system that can implement battery reactive impedance measurement in one embodiment.

FIG. 1 is a diagram showing an example system that can implement battery reactive impedance measurement in one embodiment. System 100 can implement a battery pack using one or more semiconductor devices. System 100 can comprise of a battery circuit 101 and a controller 102. Battery circuit 101 can include at least one battery cell, such as battery cells 108a, . . . 108n (collectively referred to as "cells 108" herein), voltage supply 111, and at least a resistor 110. In one example embodiment, controller 102 can be connected to at least one cell monitor 104a, . . . 104m (collectively referred to as "cell monitors 104" herein) and a pack monitor 106. In another embodiment, controller 102 can include at least one cell monitor 104 and a pack monitor 106.

Each one of cells 108 can be, for example, an energy-storing unit, composed of an anode, a cathode, and an electrolyte, working together to generate power for a device or an electric/hybrid vehicle. A variety of battery cell types, each utilizing different elements, can be employed to construct a battery cell. For instance, Lithium-Ion batteries feature a lithium-based anode, while Nickel Manganese Cobalt (NMC) battery types incorporate an NMC cathode component. Voltage supply 111 can be an electrochemical impedance spectroscopy (EIS) excitation load configured to apply a sinusoidal current with a specific amplitude, such as 10 Amperes (A), to the battery cells 108. The frequency of the sinusoidal current can change within a range from 0 kilohertz (kHz) to 1 kHz. In addition, the EIS excitation load can be configured to apply excitation using a voltage. Each one of cell monitors 104 can be, for example, an integrated circuit (IC) configured to monitor and receive information of a battery cell including voltage measurements. Each one of cell monitors 104 can be connected to one or more battery cells among battery cells 108. In the embodiment shown in FIG. 1, there can be n cells 108 and m cell monitors 104. Pack monitor 106 can be, for example, an IC configured to monitor and receive information of the entire battery pack, consisting of at least one battery cell, including current measurements. The information or measurements obtained by cell monitors 104 and pack monitors 106 can prevent potential hazards such as overcharging, over-discharging, and overheating, which can lead to battery damage and safety risks. Resistor 110 can be connected between a voltage supply 111 and battery cells 108. Pack monitor 106 can sense current across resistor 110 and provide the sensed current to controller 102. While described as a resistor, resistor 110 is not limited to a resistor configured to sense current. Resistor 110 may comprise any other circuitry that is configured to sense current in battery circuit 101 (e.g., Hall Effect sensor).

Controller 102 can include one or more semiconductor devices that can implement, for example, a processor, micro-controller, central processing unit (CPU), field-program-mable gate array (FPGA) or any other circuitry that is configured to control and operate battery circuit 101. While described as a CPU in illustrative embodiments, controller 102 is not limited to a CPU in these embodiments and may comprise any other circuitry that is configured to control and operate battery circuit 101. Controller 102 can be configured to control various components of system 100, such as cell monitors 104 and pack monitor 106.

In an aspect, to measure impedance of cells 108, conventional systems can inject an excitation current into cells 108. The conventional systems can measure voltages across the cells 108 and current across resistor 110 produced from the injected excitation current. These conventional systems can demodulate the measured voltages and use Fast-Fourier Transform (FFT) to sample the demodulated voltage multiple times to obtain information such as the magnitude and phase impedance of cells 108. In another aspect, in-phase and quadrature demodulation (I/Q) demodulation techniques can be used for extracting magnitude and phase information of the impedance. However, FFT and I/Q demodulation techniques can be relatively expensive, the excitation cur-rent needs to be unique and complete knowledge of the excitation current is required. Further, these techniques may require precise timing control to be applied to the measure-ments of voltage and current needed to calculate the complex impedance. For example, the FFT method technique requires that both voltage and current are sampled at high frequency with the same clock timing, while the I/Q method technique requires that the phase of one component (voltage or current) be known for the demodulation of the other.

To be described in more detail below, controller 102 can be configured to measure complex impedance of cells 108 without using high frequency sampling or precise knowl-edge of the voltages and current, such as the phase of the individual voltage or current waveforms. Instead, a time-domain based impedance measurement system (ZIS) can be employed to allow for a more cost-effective and efficient implementation of impedance spectroscopy. The time-do-main ZIS techniques described herein may not need to depend on the input signal phase and also exhibits minimal dependence on input signal frequency. This ensures that the system's performance has no significant impact on the measured magnitude. By using frequency measurements by the pack monitor 106, phase errors can also be minimized. Furthermore, implementation with 2-wire battery connec-tions without calibration eliminates the need for additional wires and thereby reduces manufacturing costs and increases efficiency when compared to 4-wire systems. The system is compatible with existing input filters and existing systems for creating excitation, allowing for integration into estab-lished battery monitoring systems.

Figure 2:
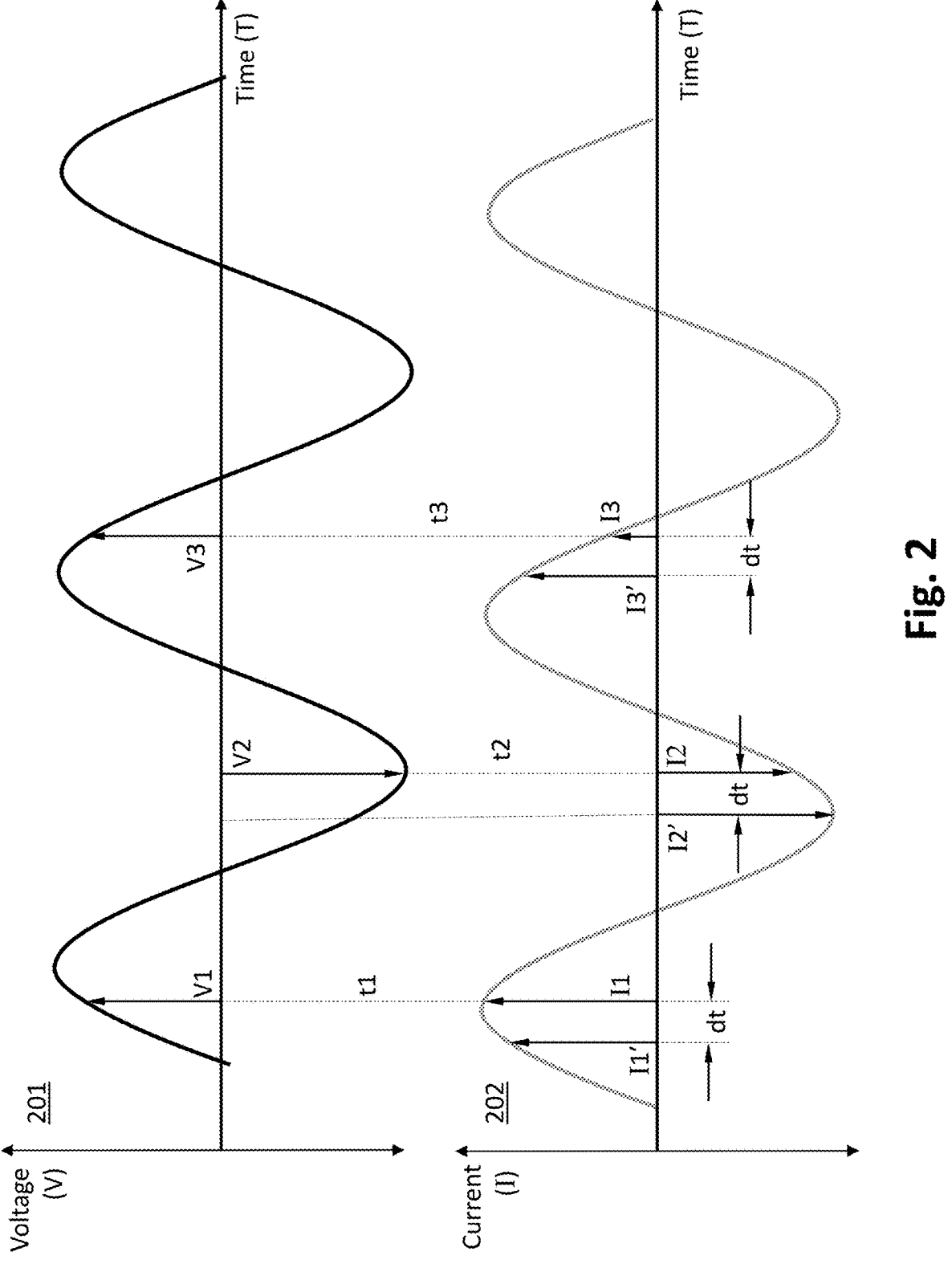
FIG. 2 is a diagram illustrating an implementation of battery reactive impedance measurement in one embodiment.

FIG. 2 is a diagram illustrating an implementation of battery reactive impedance measurement in one embodi-ment. Descriptions of FIG. 2 may reference components shown in FIG. 1. FIG. 2 depicts two waveforms, a voltage waveform 201 and a current waveform 202. In this example embodiment, the voltage waveform 201 can represent a voltage of a specific cell among cells 108 sensed by cell monitors 104, and the current waveform 202 can represent a current sensed by pack monitor 106. The voltages and current represented by voltage waveform 201 and current waveform 202 can vary with time T.

Controller 102 can be configured to sample a plurality of voltages V1, V2, V3 . . . , where V1, V2, V3 are sampled at times t1, t2, t3, respectively. Controller 102 can also sample a plurality of current values labeled as I1, I2, I3 . . . , where I1, I2, I3 are sampled at times t1, t2, t3, respectively. Controller 102 can generate a dataset V(t)/I(t)={V1/I1, V2/I2, V3/I3, . . . }. In a purely resistive battery cell, the voltage waveform 201 and the current waveform 202 can be in-phase (e.g., aligned in time), and the values in the dataset can be equivalent to one another, such as V1/I1=V2/I2=V3/I3. An impedance of the battery cell can be average of the values in dataset V(t)/I(t). Hence, when V1/I1=V2/I2=V3/I3, the average of the values in the dataset V(t)/I(t) can be any one of the values V1/I1, V2/I2, V3/I3, and the imped-ance can be any one of the values V1/I1, V2/I2, V3/I3. Further, since the values in the dataset equivalent to one another, a standard deviation of the dataset V(t)/I(t) will be equivalent to zero. Therefore, in a purely resistive battery cell, controller 102 can determine the impedance of the battery cell by sampling a voltage sensed by a corresponding cell monitor 104 and sample current sensed by pack monitor 106, and divide the sampled voltage by the sampled current.

However, in FIG. 2, the voltage waveform 201 and the current waveform 202 are out of phase. When the voltage waveform 201 and the current waveform 202 are out of phase, each value among V1/I1, V2/I2, V3/I3 in the dataset can deviate from the impedance of the battery cell, and can be different from another such as V1/I1≠V2/I2≠V3/I3. Fur-ther, the standard deviation of the dataset will be a nonzero value (e.g., greater than zero) when the voltage and current are out of phase. Therefore, when the voltage waveform 201 and the current waveform 202 are out of phase, controller 102 cannot solely rely on a sampled voltage and a sampled current to determine the impedance of the battery cell. To determine the impedance of the battery cell when the battery cell's voltage and current are out of phase, controller 102 can perform a time-domain ZIS technique to determine a time offset dt shown in FIG. 2. The time offset dt can be a time shift amount that causes the voltage waveform 201 and the current waveform 202 to be in-phase. By way of example, as shown in FIG. 2, if current waveform 202 is time shifted by time offset dt, then voltage waveform 201 and current waveform 202 can be in-phase. Note that for a purely resistive battery cell, the time offset can be consid-ered as zero.

Upon determining time offset dt, controller 102 can use the time offset dt to identify current values that will lead to a determination of the impedance of the battery cell. Refer-ring to the example in FIG. 2, controller 102 can sample a current I1' at a time t1−dt, a current I2' at a time t2−dt, and a current I3' at a time t3−dt. Since shifting the current waveform 202 by time offset dt (or shifting the voltage waveform 201 by dt) can aligned current waveform 202 with voltage waveform 201, a dataset V(t)/I'(t)={V1/I1', V2/I2', V3/I3', . . . } can include values that are equivalent to one another (e.g., V1/I1'=V2/I2'=V3/I3') and any one of the values V1/I1', V2/I2', V3/I3' can be the impedance value of the battery cell. Note that similar to a purely resistive battery cell, the standard deviation of the dataset V(t)/I'(t) will be equivalent to zero. Therefore, controller 102 can determine the time offset dt and use time offset dt to identify a voltage-current ratio such as V1/I1', or V2/V2, or V3/V3' in FIG. 2, to determine the impedance of the battery cell that is not purely resistive.

Figure 3:
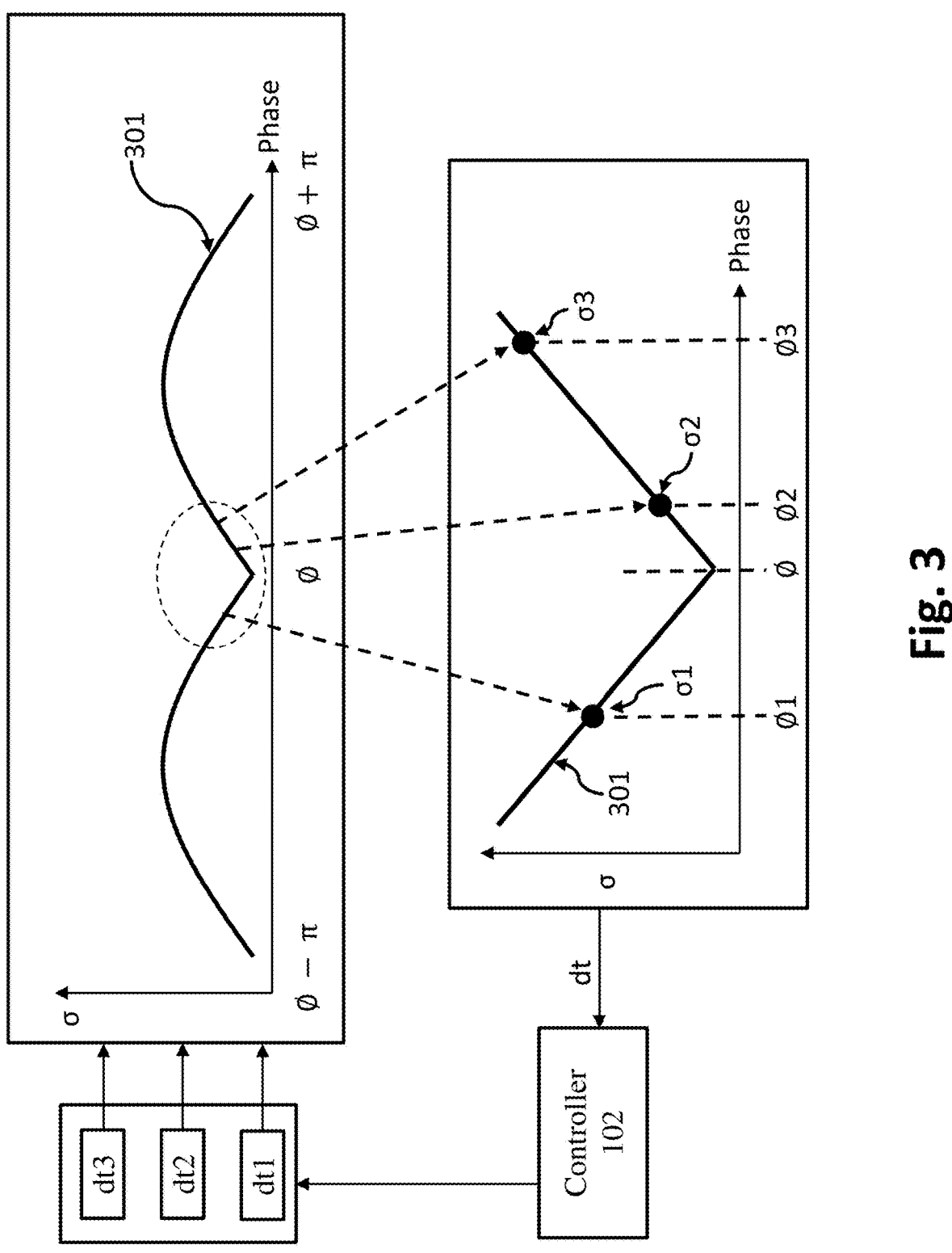
FIG. 3. is a diagram illustrating a determination of a time offset for battery reactive impedance measurement in one embodiment.

FIG. 3. is a diagram illustrating a determination of a time offset for battery reactive impedance measurement in one embodiment. Descriptions of FIG. 3 may reference components shown in FIG. 1 and FIG. 2. In an embodiment shown in FIG. 3, controller 102 can determine the time offset dt by using a plurality of candidate time offsets to estimate a phase value corresponding to the time offset dt. Referring to FIG. 1, in one embodiment, controller 102 can inject a stimulation signal, such as a stimulation current or a stimulation voltage, through battery cells 108. In one embodiment, controller 102 can control voltage source 111 to provide the stimulation signal. Cell monitors 104 can be configured to sense the stimulation voltages being applied to the corresponding battery cells and pack monitor 106 can be configured to sense the stimulation current flowing through battery cells 108. Controller 102 can select the plurality candidate time offsets, such as dt1, dt2, dt3. The number of candidate time offsets selected by controller 102 can be arbitrary. Controller 102 can obtain the sensed voltage and current and apply each one of the candidate time offsets on the obtained current to phase shift the current (or apply the candidate time offsets to phase shift the voltage). For each candidate time offset, after the phase shift, controller 102 can sample the voltages and the phase shifted current (or current and phase shifted voltage) to generate a dataset corresponding to the applied candidate time offset. By way of example, referring to FIG. 2, controller 102 can phase shift current waveform 202 by dt1 and generate a dataset of V(t)/I(t) values that correspond to candidate time offset dt1. Controller 102 can also phase shift current waveform 202 by dt2 and generate another dataset of V(t)/I(t) values that correspond to dt2, and phase shift current waveform 202 by dt3 and generate another dataset of V(t)/I(t) values that correspond to dt3.

In an aspect, the standard deviation of the datasets can vary with different values of dt, which are expressed in radians and represented by phase values in the example shown in FIG. 3. By way of example, the candidate time offsets are represented as phase values Ø1, Ø2, Ø3. In one embodiment, since the time offset dt (which is a target time offset), represented by a phase value Ø, causes the voltage and current to be in-phase, a standard deviation of a dataset V(t)/I(t) corresponding to the phase value Ø shall be zero or a minimum value as shown by a sample standard deviation curve 301 in FIG. 3. When controller 102 obtains the sensed voltage and sensed current from cell monitors 104 and pack monitor 106, the phase value Ø is unknown to controller 102. To identify the phase value Ø, controller 102 can determine the standard deviations σ1, σ2, σ3 of the datasets corresponding to the candidate time offsets dt1, dt2, dt3, respectively. Controller 102 can map the determined standard deviations σ1, σ2, σ3 to the phase values Ø1, Ø2, Ø3 representing the candidate time offsets dt1, dt2, dt3, respectively. Controller 102 can determine the phase value Ø based on the standard deviations σ1, σ2, σ3.

By way of example, controller 102 can perform various linear approximation techniques to estimate the phase value Ø using the standard deviations σ1, σ2, σ3. In an embodiment shown in FIG. 3, controller 102 can determine a best fit line 303 between two of the standard deviations σ1, σ2, σ3, such as σ2, σ3, and determine a line 302 that crosses the remaining standard deviation σ1 and that is orthogonal to the best fit line 303. A standard deviation value in which line 302 and 303 crosses each other can be determined by controller 102 as the minimum standard deviation and controller 102 can identify a phase mapped to this minimum standard deviation as the phase value Ø. Controller 102 can convert the phase value Ø into time unit that can be set as the time offset dt.

In one embodiment, controller 102 can select the candidate time offsets dt1, dt2, dt3 based on one or more predefined criteria. By way of example, controller 102 can set a predefined candidate time offset value as dt2, add a predefined value t' to dt2 such that dt3=dt2+t', and subtract the predefined value t' from dt2 such that dt1=dt2−t'. The predefined value t' can be relatively small, such as a time value that can be converted into 6-degrees or less (in radians). In another example, controller 102 can intentionally shift the stimulation signal being injected by a relatively small amount of time, such as X microseconds (μs), where this X can be set as dt2 and dt1, dt3 can be determined by controller 102 by adding and subtracting the predefined value t'.

In one embodiment, controller 102 can determine whether the standard deviations σ1, σ2, σ3 can be used for the impedance determination. By way of example, controller 102 can fit standard deviations σ1, σ2, σ3 on sample standard deviation curve 301. After the fitting, controller 102 can determine whether the standard deviations σ1, σ2, σ3 are on both sides (left and right) from the minimum point of sample standard deviation curve 301. If the standard deviations σ1, σ2, σ3 are on both sides from the minimum point, then controller 102 can determine that the standard deviations σ1, σ2, σ3 can be used for the impedance determination. If all the standard deviations σ1, σ2, σ3 are on one side (left or right) from the minimum point, then controller 102 can determine that the standard deviations σ1, σ2, σ3 cannot be used for the impedance determination. If the standard deviations σ1, σ2, σ3 cannot be used for the impedance determination, controller 102 can re-select the candidate time offsets dt1, dt2, dt3.

Controller 102 can use the time offset dt to determine the impedance of the battery cell. In one embodiment, as shown in FIG. 2, controller 102 can sample a current I1' at a time t1−dt, a current I2' at a time t2−dt, and a current I3' at a time t3−dt. Controller 102 can generate the dataset V(t)/I'(t)={V1/I1', V2/I2', V3/I3', . . . }, and determine an average of the values in the dataset V(t)/I'(t), where the average is the impedance. In another embodiment, referring to FIG. 2, controller 102 can shift (e.g., perform a phase shift) the current (or current waveform 202) by dt such that current I1', I2', I3' aligns with V1, V2, V3, respectively. After the shift, controller 102 can sample I1', I2', I3' and V1, V2, V3 at times t1, t2, t3 and generate the dataset V(t)/I'(t)={V1/I1', V2/I2', V3/I3', . . . }. Controller 102 can determine an average of the values in the dataset V(t)/I'(t), where the average is the impedance. Referring to FIG. 1, controller 102 perform the impedance determination described herein for each one of the battery cells 108.

FIG. 4 is a flow diagram illustrating a process to implement battery reactive impedance measurement in one embodiment. A process 400 can include one or more operations, actions, or functions as illustrated by one or more of blocks 402, 404, 406, and/or 408. Although illustrated as discrete blocks, various blocks can be divided into additional blocks, combined into fewer blocks, eliminated, performed in different order, or performed in parallel, depending on the desired implementation.

Process 400 can be performed by a controller (e.g., controller 102 described herein). Process 400 can begin at block 402. At block 402, the controller can measure a voltage of a battery cell. The process 400 can continue from block 402 to block 404. At block 404, the controller can measure a current flowing through the battery cell. The process 400 can continue from block 404 to block 406. At block 406, the controller can determine a time offset based on the voltage and the current. The time offset can cause the voltage and current to be in-phase. The process 400 can continue from block 406 to block 408. At block 408, the controller can sample the voltage and the current based on the time offset. The process 400 can continue from block 408 to block 410. At block 410, the controller can determine an impedance of the battery cell based on the sampled voltage and sampled shifted current.

In one embodiment, a stimulation signal can be injected to the battery cell. The stimulation signal can be a stimulation current or a stimulation voltage. In another embodiment, determining the time offset can include selecting a plurality of candidate time offsets. Determining the time offset can further include generating a plurality of datasets for the plurality of candidate time offsets. Determining the time offset can further include determining a plurality of standard deviations for the plurality of datasets. Determining the time offset can further include determining the time offset based on the plurality of standard deviations.

In another embodiment, the plurality of candidate time offsets can include three candidate time offsets. The plurality of datasets can include three datasets and the plurality of standard deviations can include three standard deviations. In another embodiment, the plurality of candidate time offsets can be within a predefined time range. In another embodiment, generating the plurality of dataset can include, for each one of the candidate time offset, shifting the current by a candidate time offset. Generating the plurality of dataset can further include, for each one of the candidate time offset, sampling the voltage and the current based on the candidate time offset. Generating the plurality of dataset can further include, for each one of the candidate time offset, dividing the sampled voltage by the sampled current to generate a dataset corresponding to the candidate time offset.

In another embodiment, determining the time offset based on the plurality of standard deviations can include performing linear approximation on the plurality of standard deviations to identify a minimum standard deviation that corresponds to the time offset. In another embodiment, determining the impedance of the battery cell based on the sampled voltage and sampled shifted current can include generating a dataset corresponding to the time offset. Determining the impedance of the battery cell based on the sampled voltage and sampled shifted current can further include determining an average of values in the dataset. Determining the impedance of the battery cell based on the sampled voltage and sampled shifted current can further include setting the average as the impedance.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method comprising:
measuring a voltage of a battery cell;
measuring a current flowing through the battery cell;
selecting a plurality of candidate time offsets;
generating a plurality of datasets for the plurality of candidate time offsets;
determining a plurality of standard deviations for the plurality of datasets;
determining a time offset based on the plurality of standard deviations;
shifting the current based on the determined time offset;
sampling the voltage and the shifted current based on the determined time offset; and
determining an impedance of the battery cell based on the sampled voltage and the sampled shifted current.

2. The method of claim 1, further comprising injecting a stimulation signal to the battery cell, wherein the stimulation signal is one of the current and the voltage.

3. The method of claim 1, wherein the plurality of candidate time offsets comprises three candidate time offsets, the plurality of datasets comprises three datasets and the plurality of standard deviations comprises three standard deviations.

4. The method of claim 1, wherein the plurality of candidate time offsets are within a predefined time range.

5. The method of claim 1, wherein generating the plurality of datasets comprises, for each one of the candidate time offset:

shifting the current by a candidate time offset;

sampling the voltage and the current based on the candidate time offset; and dividing the sampled voltage by the sampled current to generate a dataset corresponding to the candidate time offset.

6. The method of claim 1, wherein determining the time offset based on the plurality of standard deviations comprises:

performing linear approximation on the plurality of standard deviations to identify a minimum standard deviation that corresponds to the time offset.

7. The method of claim 1, wherein determining the impedance of the battery cell based on the sampled voltage and sampled shifted current comprises:

generating a dataset corresponding to the time offset;

determining an average of values in the dataset; and setting the average as the impedance.

8. A semiconductor device comprising a controller configured to:

obtain a voltage of a battery cell;

obtain a current flowing through the battery cell;

select a plurality of candidate time offsets;

generate a plurality of datasets for the plurality of candidate time offsets;

determine a plurality of standard deviations for the plurality of datasets;

determine a time offset based on the plurality of standard deviations;

shift the current based on the determined time offset;

sample the voltage and the shifted current based on the determined time offset; and determine an impedance of the battery cell based on the sampled voltage and the sampled shifted current.

9. The semiconductor device of claim 8, wherein the controller is configured to inject a stimulation signal to the battery cell, and the stimulation signal is one of the current and the voltage.

10. The semiconductor device of claim 8, wherein the plurality of candidate time offsets comprises three candidate time offsets, the plurality of datasets comprises three datasets and the plurality of standard deviations comprises three standard deviations.

11. The semiconductor device of claim 8, wherein the plurality of candidate time offsets are within a predefined time range.

12. The semiconductor device of claim 8, wherein the controller is configured to, for each one of the candidate time offset:

shift the current by a candidate time offset;

sample the voltage and the current based on the candidate time offset; and divide the sampled voltage by the sampled current to generate a dataset corresponding to the candidate time offset.

13. The semiconductor device of claim 8, wherein the controller is configured to:

perform linear approximation on the plurality of standard deviations to identify a minimum standard deviation that corresponds to the time offset.

14. The semiconductor device of claim 8, wherein the controller is configured to:

generate a dataset corresponding to the time offset;

determine an average of values in the dataset; and set the average as the impedance.

15. A system comprising:

a battery cell;

a cell monitor configured to measure a voltage of the battery cell;

a pack monitor configured to measure a current flowing through the battery cell; and a controller configured to:

select a plurality of candidate time offsets;

generate a plurality of datasets for the plurality of candidate time offsets;

determine a plurality of standard deviations for the plurality of datasets;

determine a time offset based on the plurality of standard deviations;

shift the current based on the determined time offset;

sample the voltage and the shifted current based on the determined time offset; and determine an impedance of the battery cell based on the sampled voltage and the sampled shifted current.

16. The system of claim 15, wherein the controller is configured to:

perform linear approximation on the plurality of standard deviations to identify a minimum standard deviation that corresponds to the time offset.

17. The system of claim 16, wherein the plurality of candidate time offsets comprises three candidate time offsets, the plurality of datasets comprises three datasets and the plurality of standard deviations comprises three standard deviations.

18. The system of claim 15, wherein the controller is configured to:

generate a dataset corresponding to the time offset;

determine an average of values in the dataset; and set the average as the impedance.

* * * * *